United States Patent
Oh et al.

(10) Patent No.: US 7,579,643 B2
(45) Date of Patent: Aug. 25, 2009

(54) CAPACITOR HAVING HIGH ELECTROSTATIC CAPACITY, INTEGRATED CIRCUIT DEVICE INCLUDING THE CAPACITOR AND METHOD OF FABRICATING THE SAME

(75) Inventors: Byung-jun Oh, Suwon-si (KR); Kyung-tae Lee, Seoul (KR); Yoon-hae Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 54 days.

(21) Appl. No.: 11/706,972

(22) Filed: Feb. 16, 2007

(65) Prior Publication Data

US 2007/0200159 A1    Aug. 30, 2007

(30) Foreign Application Priority Data

Feb. 24, 2006  (KR) .................. 10-2006-0018423

(51) Int. Cl.
*H01L 27/108*  (2006.01)
*H01L 29/94*  (2006.01)

(52) U.S. Cl. .............. 257/306; 257/307; 257/308; 257/309; 257/303; 257/296; 438/253; 438/239; 438/396; 438/381; 438/240

(58) Field of Classification Search ........... 257/300, 257/303, 306, 307, 308, 309, 296; 438/253, 438/239, 396, 381, 240
See application file for complete search history.

(56) References Cited

U.S. PATENT DOCUMENTS 6,451,667 B1    9/2002 Ning
2008/0173981 A1*  7/2008 Chinthakindi et al. ....... 257/535

FOREIGN PATENT DOCUMENTS

JP      2004-031860        1/2004
KR    1020050060401 A    6/2005

\* cited by examiner

*Primary Examiner*—Phuc T Dang
*Assistant Examiner*—Thanh Y Tran
(74) *Attorney, Agent, or Firm*—Harness, Dickey & Pierce, P.L.C.

(57) ABSTRACT

A capacitor may include a first electrode, a second electrode, a low dielectric layer, and/or a high dielectric layer. The first electrode may include at least one first electrode branch. The second electrode may face the first electrode and include at least one second electrode branch. The low dielectric layer may be formed between the first electrode branch and the second electrode branch. The high dielectric layer may be formed between the first electrode branch and the second electrode branch. The high dielectric layer may have a higher dielectric constant than the low dielectric layer.

26 Claims, 5 Drawing Sheets

CAPACITOR HAVING HIGH ELECTROSTATIC CAPACITY, INTEGRATED CIRCUIT DEVICE INCLUDING THE CAPACITOR AND METHOD OF FABRICATING THE SAME

PRIORITY STATEMENT

This application claims the benefit of priority to Korean Patent Application No. 10-2006-0018423, filed on Feb. 24, 2006, in the Korean Intellectual Property Office, the entire contents of which are incorporated herein in their entirety by reference.

BACKGROUND

1. Field

Example embodiments relate to a capacitor, and for example, to a capacitor that is formed by a conductive line and/or has high electrostatic capacity, an integrated circuit having the capacitor, and/or a method of fabricating the capacitor.

2. Description of Related Art

Capacitors may be formed in integrated circuits for various purposes. For example, a plurality of capacitors may be included in memory devices, for example random access memory (RAM), analogue devices, for example a radio frequency (RF) device or a mixed signal device, and/or large scale integrated circuits. In general, a capacitor may be configured to store as much charge as possible because charge may be lost due to leakage or other reasons. For example, as the overall size of semiconductor devices decreases, a technique that realizes a higher charge capacity in a smaller space may be desirable.

If an integrated circuit including capacitors is manufactured, the area of the integrated circuit may be reduced if the electrostatic capacity per unit area is increased, and accordingly, integration density of the integrated circuit may be increased. Various configurations of capacitors may be used in an integrated circuit, for example, a metal-insulator-metal (MIM) capacitor having a structure including a dielectric layer disposed between a pair of flat electrodes may accumulate charge using electrostatic induction between the electrodes. Accordingly, the electrostatic capacity C of the capacitor may be calculated according to the following Equation (1).

$$C = \epsilon_r \epsilon_0 S/d \tag{1}$$

where $\epsilon_r$ is the relative dielectric constant, $\epsilon_0$ is vacuum permittivity, S is the facing area of the capacitor electrodes, and d is the distance between the electrodes.

Recently, due to the development of miniaturization techniques for semiconductors, a larger number of wires may be formed per unit area by reducing gaps between the wires and/or multiple layers of wires may be stacked. Accordingly, wires in an integrated circuit may be arranged as parallel multiple layers in a surface direction or a vertical direction to have a maximum facing area per unit area. A capacitor having one or more of the various structures as described above may be a useful capacitor to increase electrostatic capacity while reducing the area of the integrated circuit according to the development of multi-layer techniques in the future.

Figure 1:
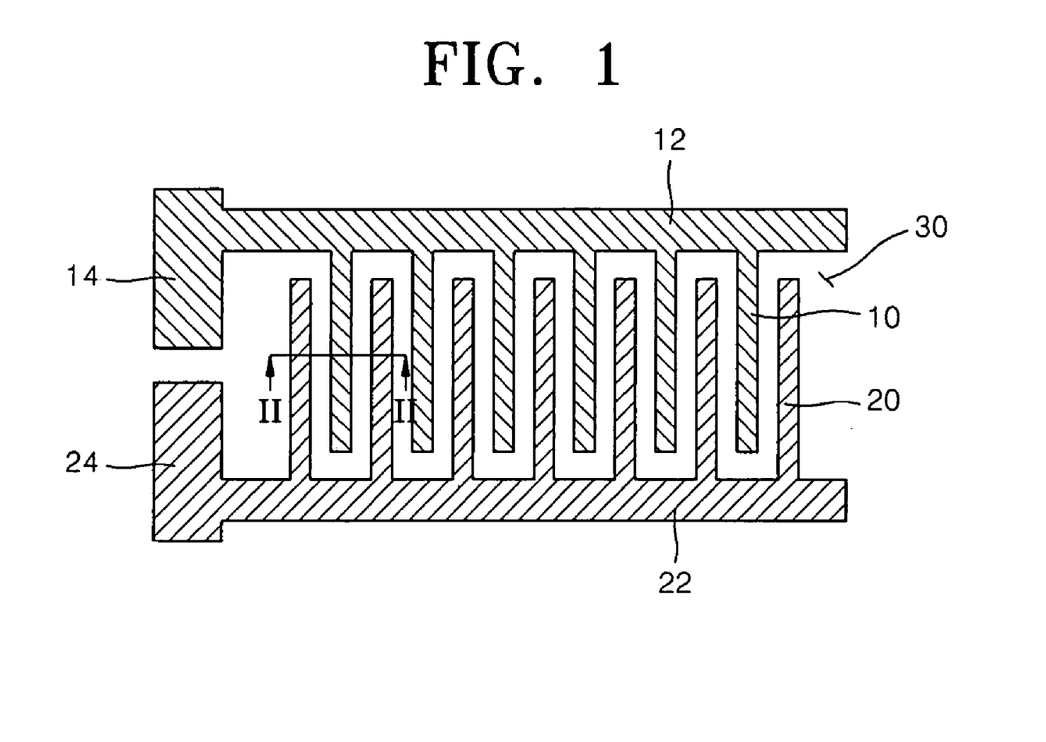
FIG. 1 is a plan view of a portion of a conventional vertical parallel plate (VPP) capacitor.

A vertical parallel plate (VPP) capacitor may be an example of a capacitor formed in an integrated circuit. FIG. 1 is a plan view of a conventional VPP capacitor structure, and FIG. 2 is a cross-sectional view taken along line II-II of FIG. 1.

Figure 2:
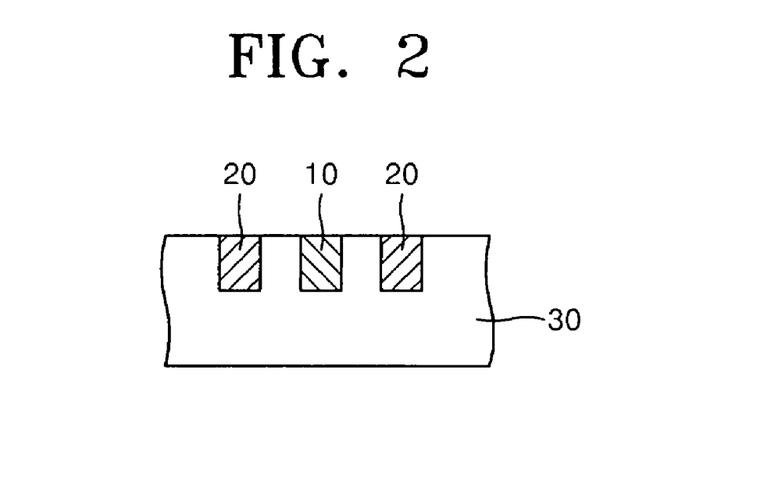
FIG. 2 is a cross-sectional view taken along line II-II of FIG. 1.

Referring to FIGS. 1 and 2, the conventional VPP capacitor may include a first pad 14 and a second pad 24 facing each other and respectively connected to an external power source (not shown), a first electrode stem 12 and a second electrode stem 22 respectively connected to the first pad 14 and the second pad 24, and a dielectric 30 between the first electrode stem 12 and the second electrode stem 22. For example, the first electrode stem 12 and the second electrode stem 22 maintain a constant distance, and a plurality of first electrode branches 10 and second electrode branches 20 respectively extend from the first electrode stem 12 and the second electrode stem 22 toward opposite electrodes. The adjacent first electrode branches 10 and second electrode branches 20 are formed in an interlock shape. Namely, the first electrode stem 12 with the first electrode branches 10 interdigitate with the second electrode stem 22 with the second electrode branches 20.

The electrostatic capacity of the conventional VPP capacitor may be calculated by Equation 1 by using the areas of the electrode branches, the distance between the electrodes, and the dielectric constants of the dielectrics. Accordingly, measures to increase the electrostatic capacity of the capacitor may include using a dielectric having a higher dielectric constant, reducing the thickness of the dielectric, or increasing an area that the electrodes oppose each other by increasing the number of electrode branches. However, the reduction of the thickness of the dielectric may increase the current leakage and/or increasing the number of the electrode branches may increase the overall size of the integrated circuit, thereby limiting the increase of the electrostatic capacity. For example, if a dielectric having a higher dielectric constant such as an inter-metal dielectric (IMD) or an inter-layer dielectric (ILD) is used, there is a higher possibility of increasing the RC delay time constant.

SUMMARY

Example embodiments may provide a capacitor having a higher electrostatic capacity and that may increase electrostatic capacity per unit area.

Example embodiments may provide an integrated circuit device including the capacitor having a higher electrostatic capacity.

Example embodiments may provide a method of fabricating an integrated circuit including the capacitor having a high electrostatic capacity.

According to an example embodiment a capacitor may include a first electrode, a second electrode, a low dielectric layer, and a high dielectric layer. The first electrode may include at least one first electrode branch. The second electrode may face the first electrode and include at least one second electrode branch. The low dielectric layer may be formed between the first electrode branch and the second electrode branch. The high dielectric layer may be formed between the first electrode branch and the second electrode branch. The high dielectric layer may have a higher dielectric constant than the low dielectric layer.

According to an example embodiment, the high dielectric layer may not directly contacting the first electrode branch and the second electrode branch.

According to an example embodiment, the first electrode branch and the second electrode branch may be formed on a same plane.

According to an example embodiment, the low dielectric layer may be between the first electrode branch and the high dielectric layer and between the high dielectric layer and the second electrode branch.

According to an example embodiment, the first electrode branch, the second electrode branch, the low dielectric layer, and the high dielectric layer may be formed on the same plane.

According to an example embodiment, the high dielectric layer may include one of SiN, SiC, $HfO_2$ and a composite including at least two of SiN, SiC, and $HfO_2$.

According to an example embodiment, the first electrode branch and the second electrode branch may be buried in trenches formed in the low dielectric layer, and the high dielectric layer may be buried in a trench formed in the low dielectric layer between the first electrode branch and the second electrode branch.

According to an example embodiment, the first electrode may extend in a first direction, and the second electrode may extend in the first direction and parallel to the first electrode.

According to an example embodiment, the first electrode branch may extend from the first electrode in a second direction perpendicular to the first direction, and the second electrode branch may extend perpendicularly from the second electrode toward the first electrode such that the first and second electrode branches interdigitate.

According to another example embodiment, an integrated circuit device may include a plurality of capacitive layer structures stacked on a substrate. Each of the capacitive layer structures may include a first electrode, a second electrode, and a low dielectric layer. The first electrode may include at least one first electrode branch. The second electrode may face the first electrode and include at least one second electrode branch. The low dielectric layer may be formed between the first electrode branch and the second electrode branch. At least one of the capacitive layer structures may include a high dielectric layer formed between the first electrode branch and the second electrode branch. The high dielectric layer may have a higher dielectric constant than the low dielectric layer.

According to an example embodiment, only the uppermost capacitive layer structure may include the high dielectric layer.

According to an example embodiment, each of the plurality of capacitive layer structures may include the high dielectric layer.

According to an example embodiment, more than one, but less than all, of the plurality of capacitive layer structures may include the high dielectric layer.

According to an example embodiment, the first electrode branches in the plurality of capacitive layer structures may be formed in vertical alignment, and the second electrode branches in the plurality of capacitive layer structures may be formed in vertical alignment.

According to an example embodiment, at least one pair of the first electrode branches may be electrically connected to each other by at least one first via and/or at least one pair of the second electrode branches may be electrically connected to each other by at least one second via.

According to an example embodiment, in each capacitive layer structure the first electrode may extend in a first direction and the second electrode may extend in the first direction and/or parallel to the first electrode.

According to an example embodiment, in each capacitive layer structure the first electrode branch may extend from the first electrode in a second direction perpendicular to the first direction and/or the second electrode branch may extend perpendicularly from the second electrode toward the first electrode such that the first and second electrode branches interdigitate.

According to an example embodiment, at least one insulating layer may be disposed between two of the stacked capacitive layer structures. The at least one insulating layer may have a different etch selectivity from the low dielectric layer of the capacitive layer structures. The at least one insulating layer may be disposed over the uppermost capacitive layer structure.

According to an example embodiment, a protective insulating layer may be formed over the insulating layer disposed over the uppermost capacitive layer structure.

According to an example embodiment, the low dielectric layer may be a silicon oxide layer, and/or the at least one insulating layer may be a silicon nitride layer.

According to an example embodiment, in the at least on capacitive layer structure the high dielectric layers may not directly contact the first electrode branch and the second electrode branch.

According to an example embodiment, the first electrode branch and the second electrode branch may have the same height.

According to an example embodiment, in the at least one capacitive layer structure the high dielectric layer may have a shape complementing the shape of the first and second electrode branches.

According to an example embodiment, the high dielectric layer may include one of SiN, SiC, $HfO_2$ and a composite including at least two of of SiN, SiC, and $HfO_2$.

According to an example embodiment, the first electrode branch and the second electrode branch may be buried in trenches formed in the low dielectric layer of the capacitive layer structures. The high dielectric layer in the at least one capacitive layer structure may be buried in a trench formed in the low dielectric layer.

According to still another example embodiment, a method of manufacturing an integrated circuit device comprising a capacitor may include forming at least one capacitive layer structure over a substrate. The forming at least one capacitive layer structure over a substrate may include forming a low dielectric layer over a semiconductor substrate, forming a first electrode including at least one first electrode branch and a second electrode including at least one second electrode branch in the low dielectric layer, forming an etch mask pattern that exposes a portion of the low dielectric layer between the first electrode branch and the second electrode branch, forming a trench by removing the portion of the exposed low dielectric layer between the first electrode branch and the second electrode branch using the etch mask pattern, and/or forming a high dielectric layer, having a higher dielectric constant than the low dielectric layer, in the trench.

The method may further include, before forming the at least one capacitive layer structure, forming at least one lower capacitive layer structure over the substrate. The forming at least one lower capacitive layer structure step may include forming a lower low dielectric layer over the substrate, and/or forming a lower first electrode including at least one lower first electrode branch and a lower second electrode including at least one lower second electrode branch. The forming at least one capacitive layer structure step may form the at least one capacitive layer structure over the at least one lower capacitive layer structure.

The method may further include, before forming the at least one capacitive layer structure over the at least one lower capacitive layer structure, forming a lower etch mask pattern that exposes a portion of the lower low dielectric layer between the first electrode branch and the second electrode branch; forming a lower trench by removing the portion of the lower low dielectric layer exposed between the first electrode branch and the second electrode branch using the lower etch mask pattern; and/or forming a lower high dielectric layer, having a higher dielectric constant than the lower low dielectric layer, in the trench.

According to an example embodiment, the at least one lower capacitive layer structure may be a plurality of lower capacitive layer structures.

According to an example embodiment, the forming a lower etch mask pattern, the forming a lower trench, and/or the forming a lower high dielectric layer steps may be performed for only one of the plurality of lower capacitive layer structures.

According to an example embodiment, the forming a lower etch mask pattern, the forming a lower trench, and/or the forming a lower high dielectric layer steps may be performed for one or more, but less than all, of the plurality of lower capacitive layer structures.

According to an example embodiment, the forming a lower etch mask pattern, the forming a lower trench, and/or the forming a lower high dielectric layer steps may be performed for each of the plurality of lower capacitive layer structures.

According to an example embodiment, the method may further include forming at least one via hole to vertically connect the fist electrode branch and the second electrode branch in the at least one capacitive layer structure to the lower first electrode branch and the lower second electrode branch in the at least one lower capacitive layer structure.

According to an example embodiment, the method may further include forming at least one insulating layer between the at least one capacitive layer structure and the at least one lower capacitive layer structure. The at least one insulating layer may be formed over the capacitive layer structure.

According to an example embodiment, the method may further include forming a protective insulating layer over the insulating layer formed over the capacitive layer structure.

According to an example embodiment, the forming of the trench step does not expose the first electrode branch or the second electrode branch with the trench.

According to example embodiments, the electrostatic capacity of a capacitor may be increased by replacing a portion of a low dielectric layer formed between first electrode branches and second electrode branches that constitute the capacitor with a high dielectric layer.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those of ordinary skill in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 3:
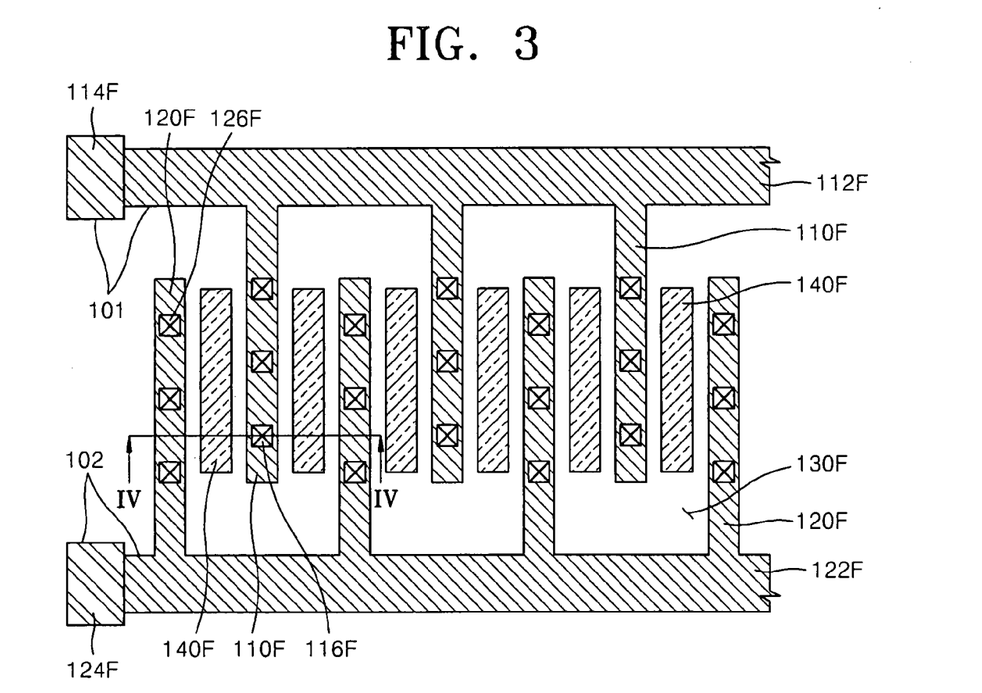
FIG. 3 is a plan view of a VPP capacitor according to an example embodiment.
Figure 4:
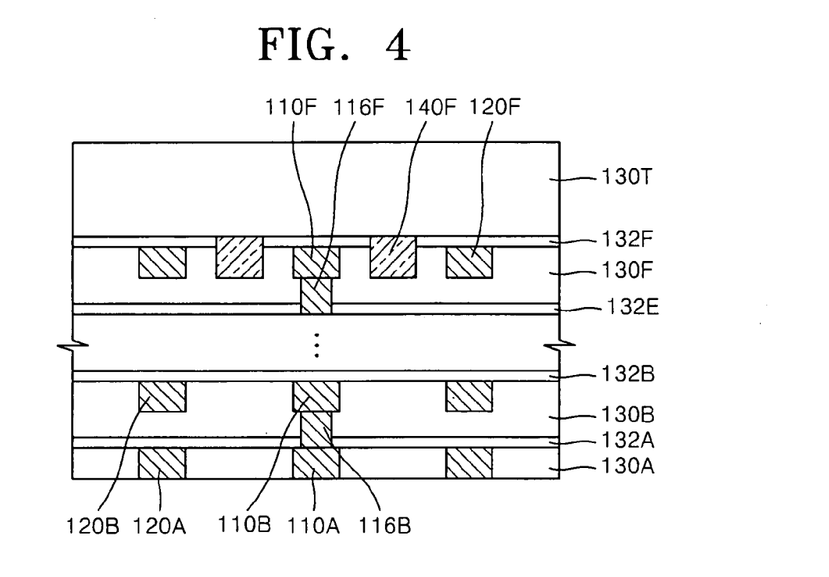
FIG. 4 is a cross-sectional view taken along line IV-IV of FIG. 3.

FIG. 3 is a plan view of an upper most layer of a vertical parallel plate (VPP) capacitor according to an example embodiment, and FIG. 4 is a cross-sectional view taken along line IV-IV of FIG. 3. As will be appreciated, FIG. 4 is a cross-sectional view of a plurality of electrode layers of the VPP stacked on a semiconductor substrate (not shown) and illustrates lower layers of the vertical parallel plate capacitor as well as the upper most layer. For example, each layer of FIG. 4 may be a capacitive layer structure.

Referring to FIGS. 3 and 4, a first electrode 101 and a second electrode 102 may face each other and form a capacitor. At an upper most layer, a low dielectric layer 130F may be interposed between the first electrode 101 and the second electrode 102. Referring to FIG. 3, the first electrode 101 may form an axis of the capacitor. The first electrode may include a first electrode stem 112F extending in a first direction from a first connection pad 114F, which may be connected to an external power source (not shown). A plurality of first electrode branches 110F may extend from the first electrode stem 112F in a second direction, perpendicular to the first direction. The second electrode 102 may form the other axis of the capacitor. The second electrode 102 may include a second electrode stem 122F extending in the first direction and parallel to the first electrode stem 112F. The second electrode stem 122F may extend from a second connection pad 124F, which may be connected to an external power source (not shown). A plurality of second electrode branches 120F may extend perpendicularly from the second electrode stem 122F towards the first electrode stem 112F such that the first and second electrode branches 110F and 120F interdigitate. Namely, the adjacent plurality of first and second electrode branches 110F and 120F may be formed in an interlock shape. The low dielectric layer 130F may be formed between the first electrode 101 and the second electrode 102.

In one embodiment, at a position in the low dielectric layer 130F between the plurality of first and second electrode branches 110F and 120F, high dielectric layers 140F having a higher dielectric constant than the low dielectric layer 130F may be formed in an island shape with a constant size.

Referring to FIGS. 3 and 4, a plurality of low dielectric layers 130A to 130F may be vertically formed. The low dielectric layers 130A through 130F may be formed as a stack from the lowermost low dielectric layer 130A to the uppermost low dielectric layer 130F. For example, an uppermost capacitive layer structure may include the lowermost low dielectric layer 130A and an uppermost capacitive layer structure may include the uppermost low dielectric layer 130F. Each low dielectric layer 130A-130E may have a stem and branch structure as discussed in detail above with respect to the upper most dielectric layer 130F illustrated in FIG. 3. Also, just as each low dielectric layer has been distinguished from the other low dielectric layers by use of the label A, B, etc. the stem and branch structures of the associated low dielectric layer use the same labeling scheme. And, while this embodiment has been illustrated as including low dielectric layers 130A-130F, it will be understood that more or less than this number of low dielectric layers may be used to form the VPP capacitor. For example, any number of capacitive layer structures may be used to form the VPP capacitor.

In the embodiment shown in FIG. 4, each of the low dielectric layers 130A through 130E does not include the high dielectric layers 140F. For example, the high dielectric layers 140F may be formed only in the uppermost low dielectric layer 130F. However, it will be understood that example embodiments are not limited to this embodiment.

Furthermore, as shown in FIG. 4, insulating layers 132A through 132F may be formed between adjacent ones of the low dielectric layers 130A through 130F, respectively, and/or on the uppermost low dielectric layer 130F. A protective insulating layer 130T may be formed on the uppermost insulating layer 132F.

The first electrode branches 110A through 110F may be formed in vertical alignment, and/or may be electrically connected through a plurality of contacts or vias 116B through 116F. Similarly, the second electrode branches 120A through 120F may be formed in vertical alignment, and/or may be electrically connected through a plurality of contacts or vias 126. Accordingly, in embodiments where the vias are formed, the first electrode 101 includes a plurality of branch and stem structures at different vertical layers, and the second electrode 102 includes a plurality of branch and stem structures at different vertical layers.

The semiconductor substrate (not shown) may be formed of one element or a compound, and/or may be a semiconductor integrated circuit substrate having at least one layer. An additional semiconductor layer may be formed on the semiconductor substrate. The semiconductor substrate may be a monocrystalline silicon substrate or a semiconductor on insulator (SOI) substrate. For example, the first and the second electrodes 101 and 102 may be formed on a desired, or alternatively, a predetermined region of the semiconductor substrate, for example, inside or on a surface of the semiconductor substrate, an insulation region, or a passivation region according to the semiconductor manufacturing process.

The first and second electrodes 101 and 102 may be formed only on a portion of the semiconductor substrate, or may be formed over multiple layers. For example, the capacitor located on the uppermost end of the semiconductor substrate may be called a final capacitor, and/or an electrode that may constitute the final capacitor may be called a final electrode. The final capacitor or the final electrode may denote that, in a conventional process of fabricating a semiconductor integrated circuit, the final capacitor or the final electrode is formed in the last process in a series of metal processes forming the electrode or the capacitor.

The following descriptions will be directed to the upper most dielectric layer 130F and associated branch and stem structures (for example, to the uppermost capacitive layer structure); however, it will be understood that these descriptions equally apply to the other low dielectric layers and associated stem and branch structures.

The first electrode stem 112F and the second electrode stem 122F respectively have the plurality of first and second electrode branches 110F and 120F. The first electrode 101 and the second electrode 102 may be disposed to face each other according to the shape of the electrode branches. For example, each of the electrode branches and/or the adjacent electrode branches may face each other and/or form an interlocking shape. Accordingly, an effective area of the electrodes may be insured to increase the electrostatic capacity of the capacitor. The plurality of first and second electrode branches 110F and 120F may be located on the same plane. The number and/or the shape of the electrode branches may be configured in various ways according to requirements. For example, as depicted in FIG. 3, the plurality of first and second electrode branches 110F and 120F may be configured perpendicularly with respect to the first and second electrode stems 112F and 122F or may be configured such that portions of the plurality of first and second electrode branches 110F and 120F may be curved or corrugated.

The first and second electrode branches 110F and 120F may be formed of a conductive material, particularly, a metal or a metal nitride, for example, Al, W, Cu, Ta, TaN, Ti, TiN, Hf, HfN, Zr, ZrN, Mo, MoN, etc.

The low dielectric layer 130F may be disposed between the first electrode 101 and the second electrode 102. The low dielectric layer 130F may have a desired, or alternatively, a predetermined dielectric constant. For example, if the low dielectric layer 130F is used as an inter-layer dielectric, the low dielectric layer 130F may be formed of a material having a lower dielectric constant because the use of a higher dielectric constant material may cause an RC delay. In general, the low dielectric layer 130F may be formed of silicon dioxide ($SiO_2$) or silicon nitride ($Si_3N_4$), and/or may be formed of other materials having a lower dielectric constant.

The high dielectric layers 140F may be located in the low dielectric layer 130F, so that the high dielectric layers 140F may be located between the plurality of first and second electrode branches 110F and 120F, and/or may be formed of a material having a higher dielectric constant than the low dielectric layer 130F. In an example embodiment, the high dielectric layers 140F may be formed in a portion of the low dielectric layer 130F located between the surfaces of the plurality of first and second electrode branches 110F and 120F facing each other. For example, the high dielectric layers 140F may be configured to not directly contact the plurality of first and second electrode branches 110F and 120F to avoid an unnecessary or unwanted chemical reaction with the plurality of first and second electrode branches 110F and 120F. For example, if the low dielectric layer 130F is an inter-layer dielectric, the RC delay may be increased according to the location and/or size of the high dielectric layers 140F with a higher dielectric constant. Therefore, if possible, the high dielectric layers 140F may be located between the electrode branches that face each other, corresponding to the area that may increase the electrostatic capacity. Furthermore, the high dielectric layers 140F may have a shape complementing the shape of the first and second electrode branches 110F and 120F. Namely, the high dielectric layers 140F are not limited to being rectangular or linear.

The high dielectric layers 140F may have a higher dielectric constant than the low dielectric layer 130F, and may be formed of, for example, SiN, SiC, $HfO_2$, etc. or a composite of these materials.

From FIGS. 1 and 3, the capacitor according to example embodiments has an increased electrostatic capacity due in part to the addition of the high dielectric layers 140F. The electrostatic capacity $C_{TO}$ of a conventional capacitor and the electrostatic capacity $C_T$ of a capacitor according to example embodiments may be compared by Equation (2) where it is assumed that the high dielectric layers 140F are formed to be equally distanced from the center of the low dielectric layer 130F between the plurality of first and second electrode branches 110F and 120F, and are formed to have the same area.

$$C_T/C_{TO} = 3k/(2k+k') \quad (2)$$

In Equation (2) above, k is the dielectric constant of the low dielectric layer 130F and k' is the dielectric constant of the high dielectric layers 140F.

According to Equation (2), the electrostatic capacity $C_T$ of a capacitor according an example embodiment is $3k/(2k+k')$ times larger than the electrostatic capacity $C_{TO}$ of a conventional capacitor. Accordingly, the capacitor according to an example embodiment may be approximately 1-1.5 times larger if k' is significantly greater than k. In order to control the increasing ratio of the electrostatic capacity, the location, length, height, area, material, etc. of the high dielectric layers 140F may be selected in various ways.

In an example embodiment, as depicted in FIG. 4, the high dielectric layers 140F may only be disposed in the uppermost low dielectric layer 130F. In a fabricating process of a semiconductor integrated circuit, the process of forming the high dielectric layers 140F, for example, a process of forming a higher dielectric for increasing electrostatic capacity may be performed after all metal wiring processes are completed, thereby simplifying the fabrication process and/or reducing fabrication costs.

Figure 5:
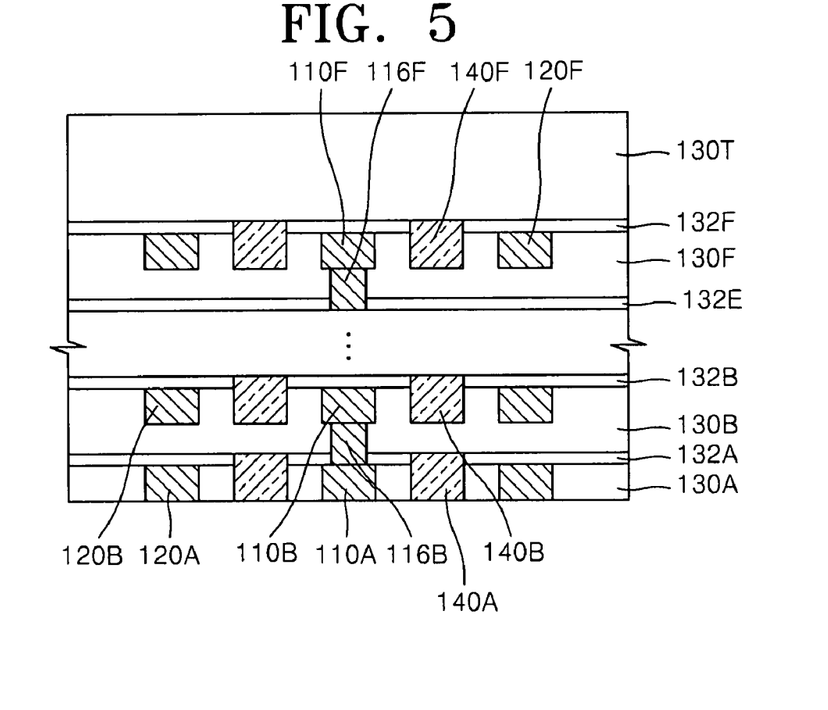
FIG. 5 is a cross-sectional view of a VPP capacitor corresponding to the cross-sectional view of FIG. 4, according to another example embodiment.

FIG. 5 is a cross-sectional view of a VPP capacitor according to another example embodiment corresponding to the cross-sectional view of FIG. 4.

If FIG. 5 is compared to FIG. 4, the first electrode branches 110A through 110F and the second electrode branches 120A through 120F may be formed in each of the stacked low dielectric layers 130A through 130F. High dielectric layers 140A through 140F may be formed between the first electrode branches 110A through 110F and the second electrode branches 120A through 120F. Accordingly, the effect of increasing the electrostatic capacity may be further enhanced.

Although FIG. 4 illustrates an example embodiment having high dielectric layers 140F only in the uppermost low dielectric layer 130F and FIG. 5 illustrates another example embodiment having high dielectric layers 140A through 140F formed between the first electrode branches 110A through 110F and the second electrode branches 120A through 120F, example embodiments are not limited thereto. Example embodiments may have any number of first electrode branches and second electrode branches, and/or high dielectric layers may be formed between one, more than one, or all of the corresponding first and second electrode branches.

FIGS. 6A through 6I are cross-sectional views illustrating a method of fabricating a VPP capacitor according to an example embodiment. In fabricating an integrated circuit device including a capacitor having a high electrostatic capacity according to an example embodiment, the fabrication of the semiconductor integrated circuit substrate and/or the metal wiring for forming the electrode portion of the capacitor may be performed using conventional techniques for fabricating the semiconductor integrated circuit. Furthermore, the formation of each layer (for example, each capacitive layer structure) will be readily apparent from the description for forming the last layer. Therefore, the following description will describe processes of fabricating a capacitor in a low dielectric layer 130F located in the uppermost layer (for example, an uppermost capacitive layer structure).

Figure 6A:
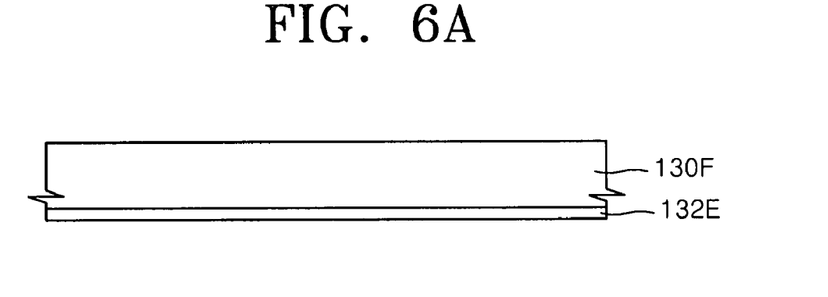
FIGS. 6A through 6I are cross-sectional views illustrating a method of fabricating a VPP capacitor according to an example embodiment.

Referring to FIG. 6A, an insulating layer 132E, for example, a silicon nitride layer having an etch selectivity with respect to the low dielectric layer, may be formed on the substrate. The insulating layer 132E may cover a lower low dielectric layer such as shown in FIG. 4 or 5. An uppermost low dielectric layer 130F, for example, a silicon oxide layer, may be formed on the insulating layer 132E.

Figure 6B:
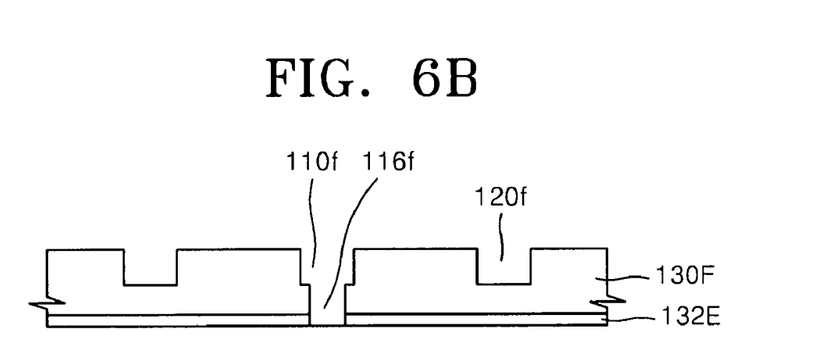

Referring to FIG. 6B, a trench 110f for the first electrode branches 110F and a trench 120f for the second electrode branches 120F may be formed in the uppermost low dielectric layer 130F using a desired, or alternatively, a predetermined photolithography process. A contact hole 116f for connecting the first electrode branches 110F and/or a contact hole (not shown) for connecting the second electrode branches 120F may be respectively formed in the trench 110f for the first electrode branches 110F and/or in the trench 120f for the second electrode branches 120F using a dual damascene process. Although not shown, the contact hole 116f for connecting the first electrode branches and the contact hole (not shown) for connecting the second electrode branches may expose the first electrode branches and/or the second electrode branches formed in a lower low dielectric layer disposed below the uppermost low dielectric layer 130F.

Figure 6C:
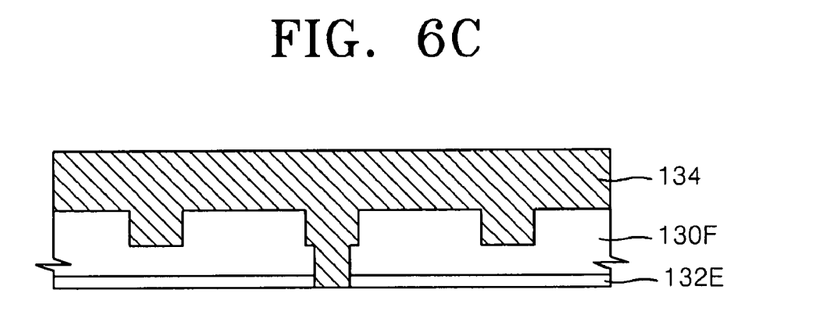

Referring to FIG. 6C, the trenches 110f and 120f and/or contact holes 116f may be filled by forming a conductive material layer 134 on the entire surface of the uppermost low dielectric layer 130F, in which the trench 110f for the first electrode branches 110F, the contact hole 116f for connecting the first electrode branches 110F, the trench 120f for the second electrode branches 120F, and the contact hole (not shown) for connecting the second electrode branches 120F may be filled.

Figure 6D:
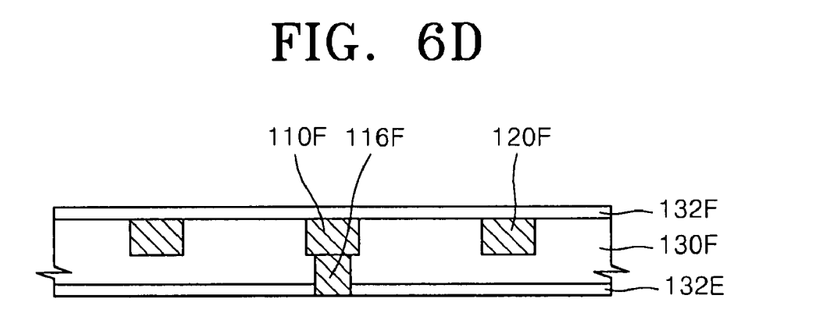

Referring to FIG. 6D, first electrode branches 110F, a contact 116F for connecting the first electrode branches 110F, and second electrode branches 120F, which may be buried in the contact hole 116f and trenches 110f and 120f, may be formed by removing a portion of the conductive material layer 134 so that the surface of the uppermost low dielectric layer 130F is exposed. This removal may be performed using an etch back process or a chemical mechanical polishing (CMP) process. An insulating layer 132F having an etch selectivity with respect to the uppermost low dielectric layer 130F may be formed on the entire surface of the uppermost low dielectric layer 130F. The insulating layer 132E or 132F may not be formed if not necessary.

Figure 6E:
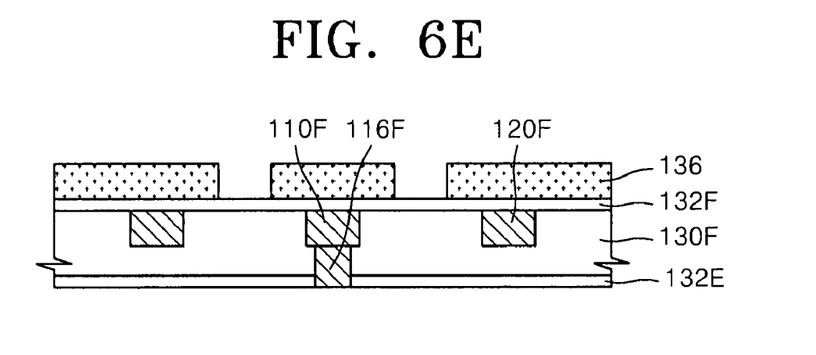

Referring to FIG. 6E, an etch mask pattern 136 may be formed on the insulating layer 132F using, for example, a photoresist material. The etch mask pattern 136 exposes a section between the adjacent first and second electrode branches 110F and 120F in a shape as depicted in FIG. 3.

Figure 6F:
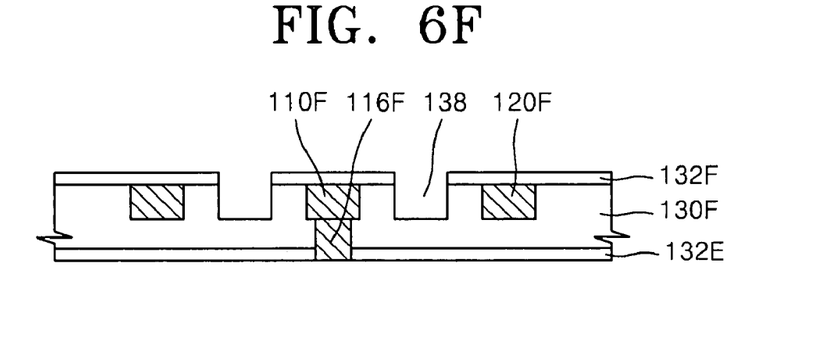

Referring to FIG. 6F, trenches 138 may be formed in the uppermost low dielectric layer 130F by removing the insulating layer 132F exposed by the etch mask pattern 136 and a portion of the uppermost low dielectric layer 130F. The trenches 138 may be formed by a dry or wet etching process to a desired, or alternatively, a predetermined shape, height, length, width, and/or etc. in consideration of the electrostatic capacity to be obtained. In the process of forming the trenches 138, the sidewalls of the first electrode branches 110F and/or the second electrode branches 120F are not exposed by the trenches 138.

Figure 6G:
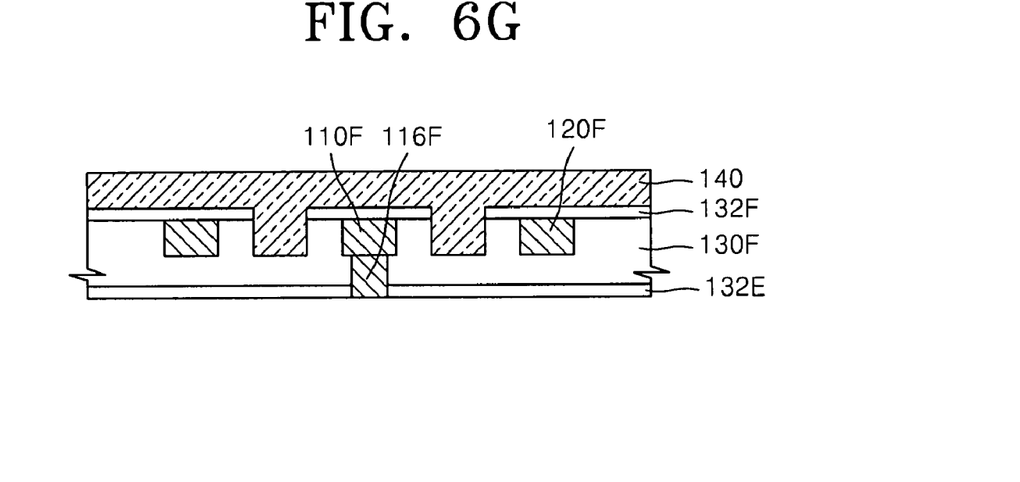

Referring to FIG. 6G, a high dielectric layer 140 is formed on the entire surface of the resultant product sufficiently enough to fill the trenches 138. The high dielectric layer 140 may have a dielectric constant higher than the low dielectric layer 130F, and may be formed of, for example, SiN, SiC, HfO$_2$, etc. or a composite of these materials.

Figure 6H:
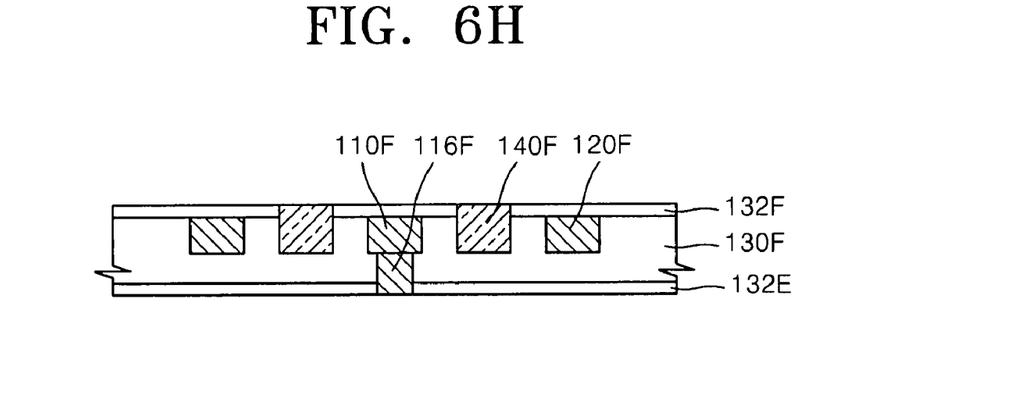

Referring to FIG. 6H, the high dielectric layer 140, but not the high dielectric layer 140 in the trenches 138, may be removed using a typical planarizing technique. Accordingly, high dielectric layers 140F may be formed in the uppermost low dielectric layer 130F between the first electrode branches 110F and the second electrode branches 120F. The planarizing may be performed using a chemical mechanical polishing (CMP) process.

Figure 6I:
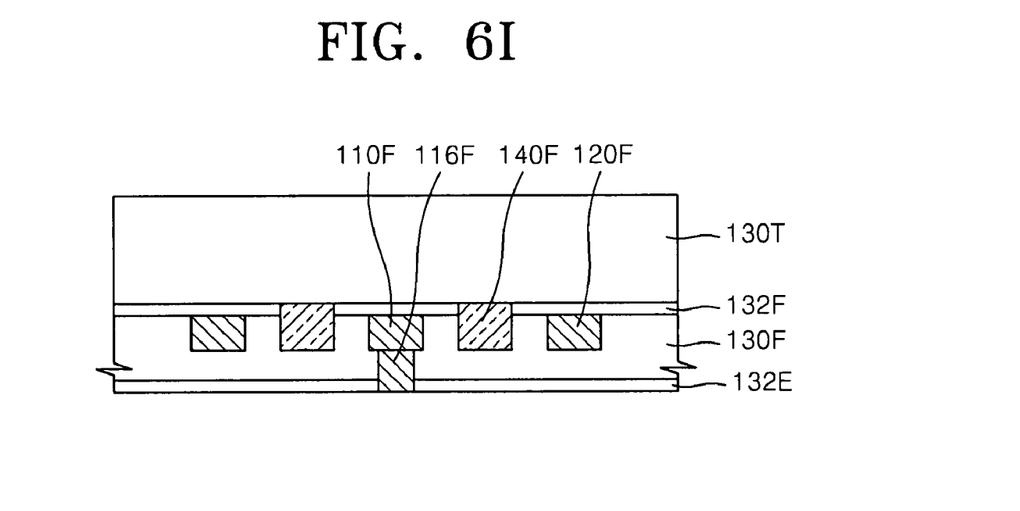

Referring to FIG. 6I, a protective layer 130T may be formed on the entire surface of the resultant product.

As described above, the forming of the first electrode branches 110F and the second electrode branches 120F in the uppermost low dielectric layer 130F has been described, but the electrode branches of the capacitors located below the uppermost low dielectric layer 130F may be formed using the same process. To obtain a maximum electrostatic capacity, high dielectric layers may be formed between the electrode branches in all of the stacked low dielectric layers, in less than all of the stacked low dielectric layers, or in only the uppermost low dielectric layer. In an example embodiment depicted in FIG. 3, straight band shaped high dielectric layers 140F are shown, but various other configurations may be realized based on shape, height, width, length, etc.

As described above, in an integrated circuit device having a capacitor, the electrostatic capacity may be increased without increasing the area and/or size by using a high dielectric layer having a higher dielectric constant than a low dielectric layer. For example, example embodiments may provide a capacitor and/or an integrated circuit device having the capacitor that has a higher electrostatic capacity that may reduce the increase in RC delay or the occurrence of undesired chemical reaction with the electrodes by forming a low dielectric layer having a lower dielectric constant as an inter-insulating layer and/or inserting a high dielectric having a higher dielectric constant in the low dielectric layer. Example embodiments may provide method of fabricating the capacitor.

Although example embodiments have been shown and described in this specification and figures, it would be appreciated by those skilled in the art that changes may be made to the illustrated and/or described example embodiments without departing from their principles and spirit.

What is claimed is:

1. A capacitor comprising:
   a first electrode including at least one first electrode branch;
   a second electrode facing the first electrode and including at least one second electrode branch;
   a low dielectric layer formed between the first electrode branch and the second electrode branch; and
   a high dielectric layer formed between the first electrode branch and the second electrode branch, the high dielectric layer having a higher dielectric constant than the low dielectric layer.

2. The capacitor of claim 1, wherein the high dielectric layer does not directly contact the first electrode branch and the second electrode branch.

3. The capacitor of claim 1, wherein the first electrode branch and the second electrode branch are formed on a same plane.

4. The capacitor of claim 1, wherein
   the low dielectric layer is between the first electrode branch and the high dielectric layer and between the high dielectric layer and the second electrode branch.

5. The capacitor of claim 4, wherein the first electrode branch, the second electrode branch, the low dielectric layer, and the high dielectric layer are formed on a same plane.

6. The capacitor of claim 1, wherein the high dielectric layer includes one of SiN, SiC, HfO$_2$, and a composite including at least two of SiN, SiC, and HfO$_2$.

7. The capacitor of claim 1, wherein
   the first electrode branch and the second electrode branch are in trenches in the low dielectric layer, and
   the high dielectric layer is in a trench in the low dielectric layer.

8. The capacitor of claim 1, wherein
   the first electrode extends in a first direction, and
   the second electrode extends in the first direction and parallel to the first electrode.

9. The capacitor of claim 8, wherein
   the first electrode branch extends from the first electrode in a second direction perpendicular to the first direction, and
   the second electrode branch extends perpendicularly from the second electrode toward the first electrode such that the first and second electrode branches interdigitate.

10. An integrated circuit device comprising:
a plurality of capacitive layer structures stacked on a substrate, each of the capacitive layer structures including,
a first electrode including at least one first electrode branch;
a second electrode facing the first electrode and including at least one second electrode branch, and
a low dielectric layer formed between the first electrode branch and the second electrode branch; and
at least one of the capacitive layer structures including a high dielectric layer formed between the first electrode branch and the second electrode branch, the high dielectric layer having a higher dielectric constant than the low dielectric layer.

11. The integrated circuit device of claim 10, wherein only the uppermost capacitive layer structure includes the high dielectric layer.

12. The integrated circuit device of claim 10, wherein each of the plurality of capacitive layer structures include the high dielectric layer.

13. The integrated circuit device of claim 10, wherein more than one, but less than all, of the plurality of capacitive layer structures include the high dielectric layer.

14. The integrated circuit device of claim 10, wherein
the first electrode branches in the plurality of capacitive layer structures are formed in vertical alignment, and
the second electrode branches in the plurality of capacitive layer structures are formed in vertical alignment.

15. The integrated circuit device of claim 14, wherein at least one pair of the first electrode branches is electrically connected to each other by at least one first via and at least one pair of the second electrode branches are electrically connected to each other by at least one second via.

16. The capacitor of claim 10, wherein in each capacitive layer structure
the first electrode extends in a first direction, and
the second electrode extends in the first direction and parallel to the first electrode.

17. The capacitor of claim 16, wherein in each capacitive layer structure
the first electrode branch extends from the first electrode in a second direction perpendicular to the first direction, and
the second electrode branch extends perpendicularly from the second electrode toward the first electrode such that the first and second electrode branches interdigitate.

18. The integrated circuit device of claim 10, further comprising:
at least one insulating layer disposed between two of the capacitive layer structures, the at least one insulating layer having a different etch selectivity from the low dielectric layer of the capacitive layer structures.

19. The integrated circuit device of claim 18, wherein the at least one insulating layer is disposed over the uppermost capacitive layer structure.

20. The integrated circuit device of claim 19, further comprising:
a protective insulating layer formed over the insulating layer disposed over the uppermost capacitive layer structure.

21. The integrated circuit device of claim 18, wherein
the low dielectric layer is a silicon oxide layer, and
the at least one insulating layer is a silicon nitride layer.

22. The integrated circuit device of claim 10, wherein in the at least one capacitive layer structure the high dielectric layer does not directly contact the first electrode branch and the second electrode branch.

23. The integrated circuit device of claim 10, wherein the first electrode branch and the second electrode branch have a same shape.

24. The integrated circuit device of claim 23, wherein in the at least one capacitive layer structure the high dielectric layer has a shape complementing the shape of the first and second electrode branches.

25. The integrated circuit device of claim 10, wherein the high dielectric layer includes one of SiN, SiC, $HfO_2$, and a composite including at least two of SiN, SiC, and $HfO_2$.

26. The integrated circuit device of claim 10, wherein
the first electrode branch and the second electrode branch are in trenches formed in the low dielectric layer of the capacitive layer structures, and
the high dielectric layer in the at least one capacitive layer structure is buried in a trench formed in the low dielectric layer.

* * * * *